US011127874B2

United States Patent
Campbell et al.

(10) Patent No.: US 11,127,874 B2
(45) Date of Patent: Sep. 21, 2021

(54) ELECTRONIC DEVICE COMPRISING A CHIP PROVIDED WITH AN OPTICAL SENSOR

(71) Applicant: STMICROELECTRONICS (RESEARCH & DEVELOPMENT) LIMITED, Marlow (GB)

(72) Inventors: Colin Campbell, Darvel (GB); Maria Rosa Lopez Borbones, Edinburgh (GB); Dominique Nuyts, Edinburgh (GB)

(73) Assignee: STMICROELECTRONICS (RESEARCH & DEVELOPMENT) LIMITED, Marlow (GB)

( * ) Notice: Subject to any disclaimer, the term of this patent is extended or adjusted under 35 U.S.C. 154(b) by 0 days.

(21) Appl. No.: 16/594,792

(22) Filed: Oct. 7, 2019

(65) Prior Publication Data

US 2020/0119219 A1  Apr. 16, 2020

(30) Foreign Application Priority Data

Oct. 11, 2018  (FR) ........................................ 1859451

(51) Int. Cl.
*H01L 31/12* (2006.01)
*H01L 31/18* (2006.01)
*H01L 31/0203* (2014.01)
*H01L 31/0232* (2014.01)

(52) U.S. Cl.
CPC .......... *H01L 31/12* (2013.01); *H01L 31/0203* (2013.01); *H01L 31/02327* (2013.01); *H01L 31/18* (2013.01)

(58) Field of Classification Search
CPC ...................................................... H01L 31/18
See application file for complete search history.

(56) References Cited

U.S. PATENT DOCUMENTS

| 2004/0217454 | A1 | 11/2004 | Brechignac et al. |
| 2007/0228558 | A1 | 10/2007 | Brechignac et al. |
| 2007/0272827 | A1* | 11/2007 | Heo ................. H01L 27/14625 250/208.1 |
| 2009/0201414 | A1 | 8/2009 | Kinoshita |
| 2013/0049598 | A1* | 2/2013 | Nagashima ............ F21K 9/278 315/113 |
| 2018/0058920 | A1 | 3/2018 | Saxod et al. |
| 2019/0027416 | A1* | 1/2019 | Saxod ................. H01L 23/3142 |

* cited by examiner

*Primary Examiner* — William A Harriston
(74) *Attorney, Agent, or Firm* — Seed IP Law Group LLP

(57) ABSTRACT

An electronic device, comprising: a support plate having a rear face and a front face; an electronic integrated circuit chip having a rear face mounted on the front face of the support plate and including an optical component in a front face; and a sleeve forming a traversing passage and having a rear edge and a front edge at the opposite ends of the traversing passage, the rear edge being mounted on the front face of the chip, in such a position that the optical component of the chip is facing the traversing passage of the sleeve.

20 Claims, 4 Drawing Sheets

ELECTRONIC DEVICE COMPRISING A CHIP PROVIDED WITH AN OPTICAL SENSOR

BACKGROUND

Technical Field

Embodiments of the present disclosure relate to the field of electronic devices, in particular those intended to contain electronic integrated circuit chips having optical sensors.

Description of the Related Art

In general, electronic devices have electronic integrated circuit chips having optical sensors.

BRIEF SUMMARY

Typically an electronic device comprises a support plate, an electronic integrated circuit chip, and a sleeve. The support plate has a rear face and a front face. The circuit chip has a rear face mounted on the front face of the support plate and includes an optical component in a front face. The sleeve forms a traversing passage and has a rear edge and a front edge at the opposite ends of the traversing passage. The rear edge is mounted on the front face of the chip, in such a position that the optical component of the chip is facing the traversing passage of the sleeve.

Thus, the sleeve directly mounted on the chip constitutes a lateral barrier permitting the light to traverse only the traversing passage of the sleeve toward the optical component or from the optical component.

The traversing passage of the sleeve can be provided with at least an optical element allowing light to pass through.

A glue bead can be inserted between the front face of the chip and the rear edge of the sleeve.

The device can comprise a cap comprising a front wall extending at a distance in front of the chip, and a peripheral wall having a rear end edge mounted on the support plate, such as to delimit a chamber in which the chip is located, the front wall of the cap having a through passage for the sleeve.

A glue bead can be inserted between the support plate and the end edge of the peripheral wall of the cap.

A glue bead can be inserted between the sleeve and the front wall of the cap, along the through passage of the front wall of the cap.

The sleeve can comprise a rear portion inside the chamber of the cap and a front portion traversing the through passage of the front wall of the cap.

A gap can be provided between the sleeve and the through passage of the cap.

The chip can include another optical component in the front face, which is located outside the sleeve.

The device can comprise another electronic integrated circuit chip having a rear face mounted on the front face of the support plate and including an optical component in a front face, the front wall of the cap having a through passage provided with an optical element letting pass the light through and situated in front of this optical component.

Projecting ribs can be provided to connect the sleeve and the cap in the chamber of the cap such as to divide the chamber of the cap into two chamber portions, and wherein the other optical component and the other chip are located in the same chamber portion.

The cap can comprise an internal partition divided the chamber of the cap into two chamber portions, the sleeve being located in one of these chamber portions and the other chip being located in the other chamber portion.

The cap can comprise an internal partition divided the chamber of the cap into two chamber portions, the sleeve being located in one of these chamber portions and the other chip and the other optical component being located in the other chamber portion.

BRIEF DESCRIPTION OF THE SEVERAL VIEWS OF THE DRAWINGS

Electronic devices will now be described by way of nonlimiting exemplary embodiments, illustrated by the drawing in which.

DETAILED DESCRIPTION

Figure 1:
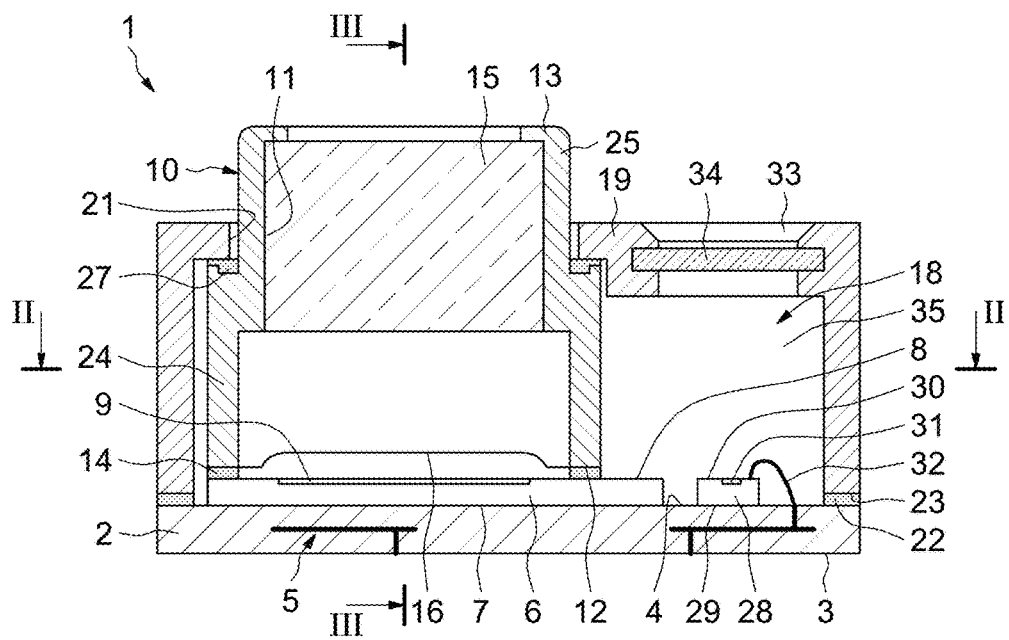
FIG. 1 represents a longitudinal cross-section of an electronic device.
Figure 2:
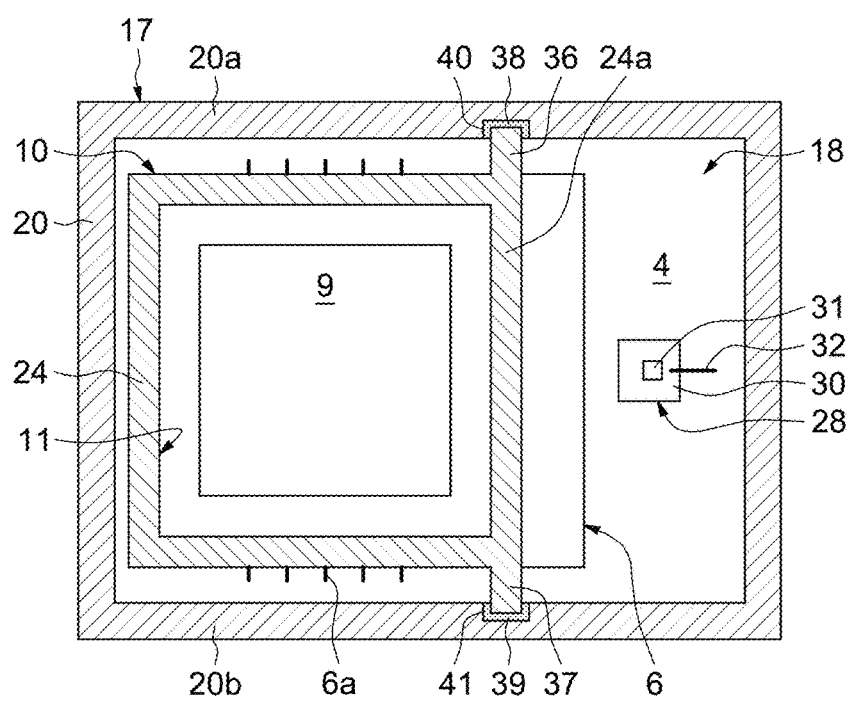
FIG. 2 represents a plan cross-section, according to II-II of the electronic device of FIG. 1.
Figure 3:
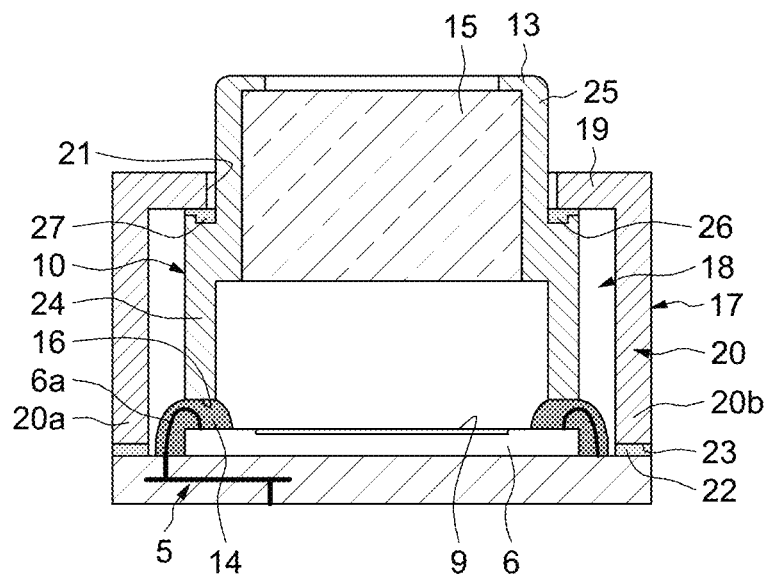
FIG. 3 represents a transverse local cross-section, according to of the electronic device of FIG. 1.
Figure 4:
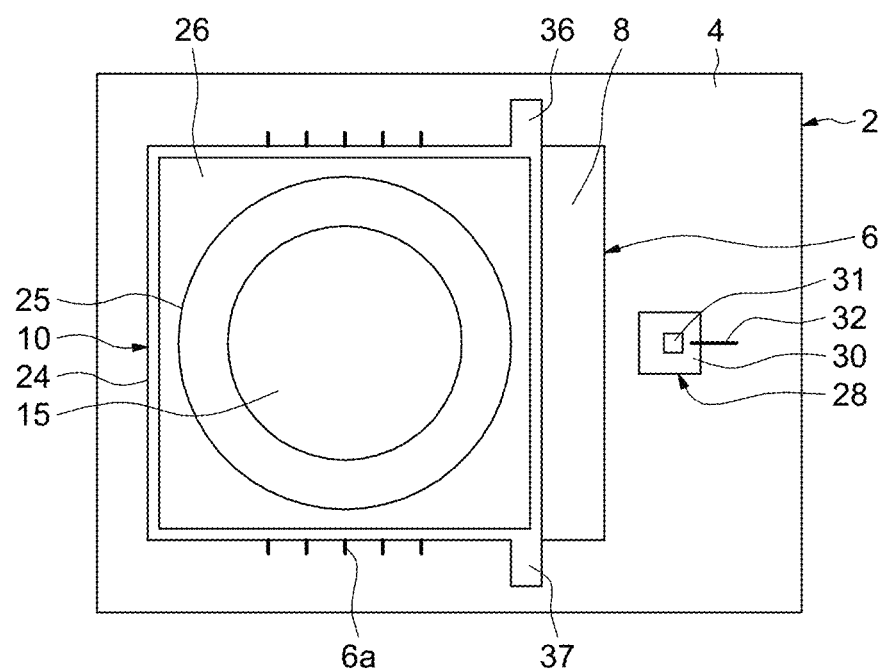
FIG. 4 represents a top view of the electronic device of FIG. 1, without a cap thereof.

According to a variant embodiment, an electronic device 1, illustrated on FIGS. 1-4, comprises a rectangular support plate (or substrate) 2, made of an insulated material, having a rear face 3 and a front face 4, and including an integrated network 5 of electrical connections from one face to the other. For example, the support plate 2 is rectangular.

The electronic device 1 comprises an electronic integrated circuit chip 6 having a rear face 7 mounted on the front face 4 of the support plate 2, by means of a glue layer, and a front face 8 which includes a local optical component such as a light sensor 9. The chip 6 is rectangular and has edges which are distant from and parallel to the edges of the support plate.

The electronic device 1 comprises a sleeve (or barrel) 10 forming a traversing passage 11 and having a rear edge 12 and a front edge 13 at the opposite ends of the traversing passage 11.

The sleeve 10 is mounted on the front face 8 of the chip 6 in such a position that the light sensor 9 of the chip 6 is facing the traversing passage 11, and that the rear edge 12 surrounds at a distance the light sensor 9. The axis of the sleeve 10 is placed perpendicularly to the front face 8 of the chip 6.

The rear edge 12 of the sleeve 10 is attached to the front face 8 of the chip 6, by means of a glue bead 14.

So, the sleeve 10 constitutes a specific and local light guide via the traverse passage 11.

The sleeve 10 carries an optical element 15 situated inside the traversing passage 11 and facing at a distance the light sensor 9. The optical element 15 allows light to pass through. The optical element 15 can include one or more an optical lens and a light filter. In one embodiment, the optical element includes two optical lenses coupled together and to the sleeve 10.

The natural or ambient light traverses the optical element 15 and reaches the light sensor 9. Advantageously, the sleeve 10 and the glue bead 14 are adapted such that the natural or ambient light reaching the light sensor 9 is issued only from the front end of the traversing passage 11 of the sleeve 10.

The sleeve 10 is mounted on the support plate 2 such that the optical axis of light sensor and the optical axis of the optical element 15 are confused.

The chip 6 is electrically connected to the connection network of the support plate 2 by means of electrical connection wires 6a (FIGS. 3 and 4) which connect front pads of the chip 6 and front pads of the support plate 2.

According to one embodiment, the front pads of the chip 6 are situated outside the region of the front face 8 of the chip 6 covered by the sleeve 10.

According to another embodiment shown in the drawings, the sleeve 10 has indentations 16 formed in the rear edge 12. The front pads of the chip 6 are situated in the region of the indentations 16 and portions of the wires 6a enter inside the indentations 16. In this case, the glue bead 14 fills the indentations 16, and the wires 6a are at least partially drowned in the glue bead 14.

The electronic device 1 comprises a cap 17 which delimits a chamber 18 forward the support plate 2, which contains the chip 6 and at least a rear portion of the sleeve 10.

The cap 17 comprises a front wall 19 and a peripheral wall 20.

The front wall 19 is at a distance over the support plate 2 and has an opening 21 which coincides with the sleeve 10 such that the passage 11 of the sleeve 10 is opened to the outside for letting pass the natural light towards the passage 11 of the sleeve 10.

The peripheral wall 20 extends backwards from the front wall 19 and towards a peripheral zone of the front face 4 of the support plate 2.

The cap 17 is attached to the support plate 2 by means of a glue bead 22 interposed between the peripheral zone of the front face 4 of the support plate 2 and a rear edge 23 of the peripheral wall 20.

The sleeve 10 comprises a rear portion 24 in the chamber 18 and a front portion 25 which traverses freely the opening 21 of the front wall 19 of the cap 17.

Between the rear portion 24 in the chamber 18 and the front portion 25, the sleeve 10 has a peripheral shoulder 26 facing a zone of the rear face of the front wall 19 surrounding the opening 21. A glue bead 27 is interposed between the shoulder 26 and the front wall 19.

The rear portion 24 has a square section, the sides of which are parallel to the edge of the chip 6. The indentations 16 are made in two opposite sides thereof. The front portion 25 has a cylindrical section and contains the optical element 15.

The glue bead 22 and/or the glue beads 27 are formed such that the natural light is prevented from reaching the light sensor 9 other than through the front end of the traversing passage 11 of the sleeve 10.

The electronic device 1 comprises another electronic integrated circuit chip 28 mounted on the front face 4 of the support plate 2 at a distance from the chip 6 and in chamber 18 of the cap 17.

The chip 28 has a rear face 29 fixed to the front face 4 of the support plate 2, and a front face 30 which includes a local optical component such as a light emitter 31.

The chip 28 is connected electrically to the connection network 5 by connection means including an electrical connection wire 32.

The front wall 19 of the cap 17 has an opening 33 in front of the light emitter 31 and provided with an optical element 34 allowing light to pass through. The optical element 34 can include an optical lens and eventually a light filter.

The sleeve 10 is linked to the chip 6 and the cap 17 so as to constitute a barrier such that the light emitted by the emitter 31 does not reach the light sensor 9 directly via the chamber 18 of the cap 17.

Advantageously, the glue bead 14 contributes to achieve this result.

Nevertheless, this result can also be achieved by linking the sleeve 10 to the chip 6 and the cap 17 so as to delimit a chamber portion 35 of the chamber 18 in which the chip 28 is located.

For delimiting the chamber portion 35, the rear portion 24 of the sleeve 10 has a side 24a turned on the side of the chip 28, and comprises opposite projecting ribs 36 and 37 which extend towards opposite sides 20a and 20b of the peripheral wall 20 of the cap 17. The ribs 36 and 37 are attached to the peripheral wall 20, to the support plate 2, and to the front wall 19, by means of glue beads 38 and 39, which join the glue beads 14 and 27.

Advantageously, the opposite sides 20a and 20b of the peripheral wall 20 of the cap 17 have slots 40 and 41 facing the edges of the ribs 36 and 37 and receiving the glue beads 38 and 39.

So, the side 24a and the ribs 36 and 37 of the rear portion 24 of the sleeve 10, the portion of the glue bead 14 linking the side 24a to the chip 6, the portion of the glue bead 27 linking the sleeve 10 to the front wall 19 of the cap 17, and the glue beads 38 and 39 constitute a barrier which contributes to prevent the light emitted by the emitter 31 of the chip 28 to reach the light sensor 9 of the chip 6.

The chip 6 is programmed to command the emitter 31 of the chip 28 and to treat the signals issued from the light sensor 9.

The electronic device 1 can be manufactured as following.

Chips 6 and 28 are mounted on a support plate 2 and connected electrically to an electrical connection network 5 of the support plate 2, as previously described.

A sleeve 10 carrying an optical element 15 is mounted on the chip 6 and linked by means of a glue bead 14, as previously described, the sleeve 10, and in consequence the optical element 15 relatively to the light sensor 9 of the chip 6 being placed as desired.

A cap 17 carrying an optical element 34 is mounted on the support plate 2 and linked by means of glue beads 14, 27, and, optionally, 38 and 39, as previously described, the cap 17, and in consequence the optical element 34 relatively to the emitter 31 of the chip 28 being placed as desired regardless of the position of the sleeve 10 because of the peripheral gap between the front portion 25 of the sleeve 10 and the opening 21 of the front wall 19 of the cap 17.

Figure 5:
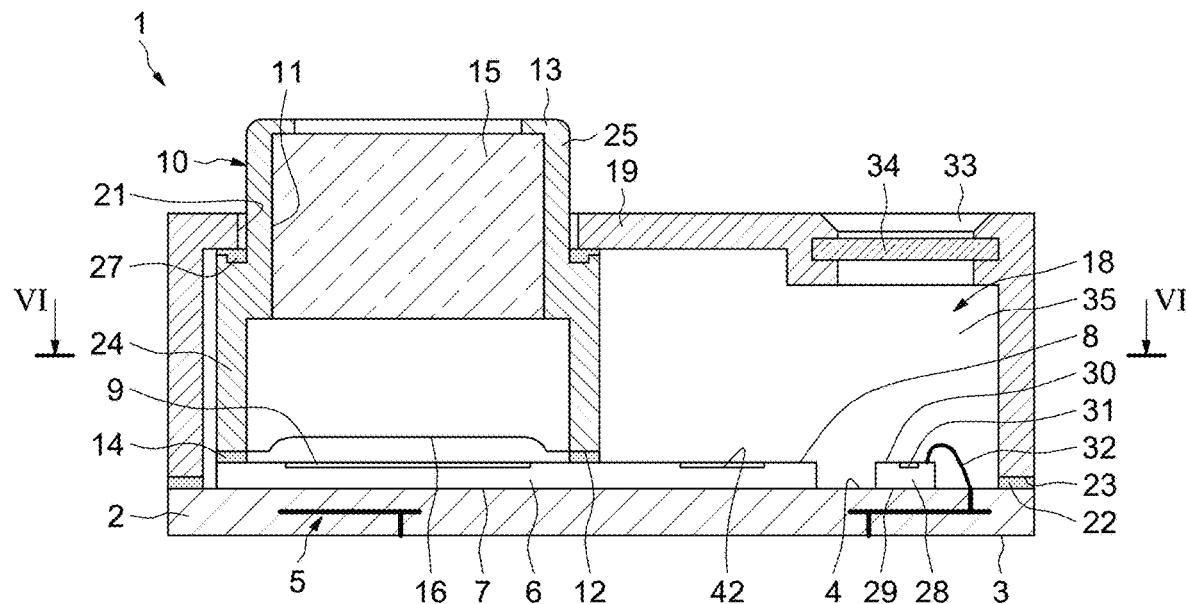
FIG. 5 represents a longitudinal cross-section of a variant embodiment of the electronic device of FIG. 1.
Figure 6:
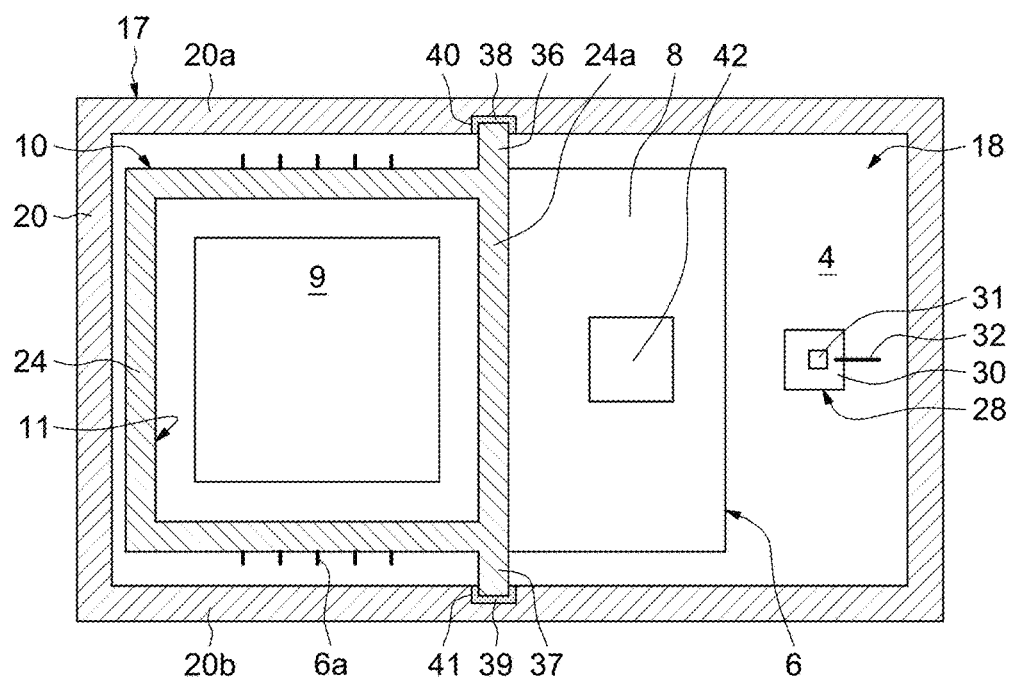
FIG. 6 represents a transverse local cross-section, according to VI-VI of the electronic device of FIG. 5.

FIGS. 5 and 6 illustrate a variant embodiment of the electronic device 1 of FIGS. 1-4, in which the front face 8 of the chip 6 includes a local optical component such as a light sensor 42, which is located outside and at a distance from the sleeve 10 and on the side of the chip 28. The light emitted by the emitter 31 of the chip 28 in the chamber 18 reaches the light sensor 42.

Figure 7:
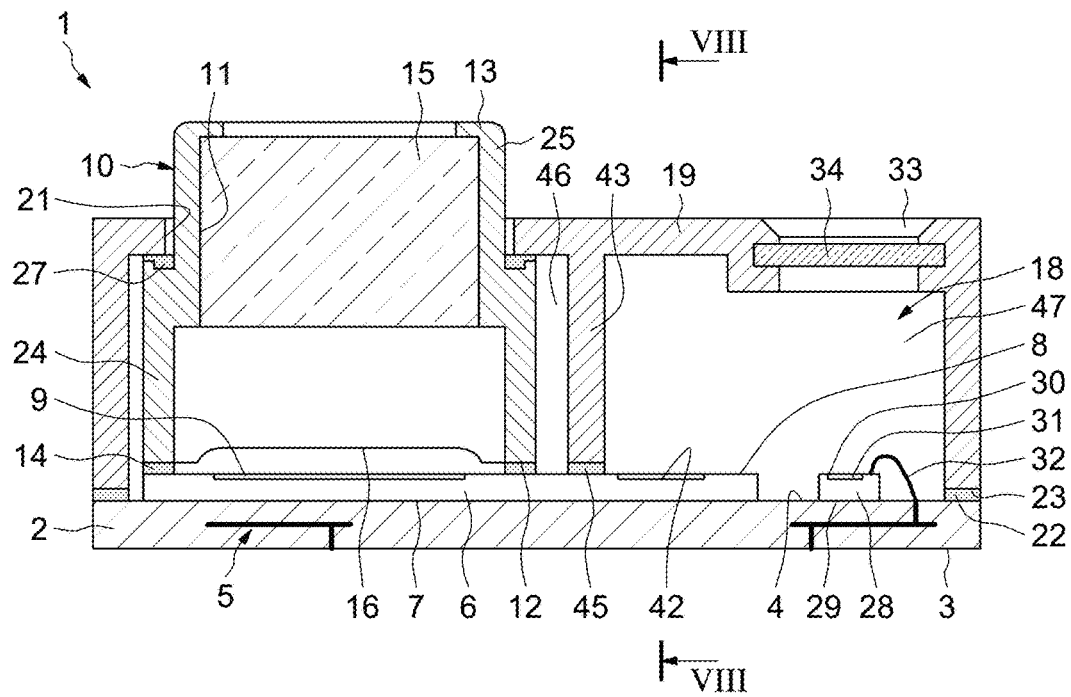
FIG. 7 represents a longitudinal cross-section of a variant embodiment of the electronic device of FIG. 5.
Figure 8:
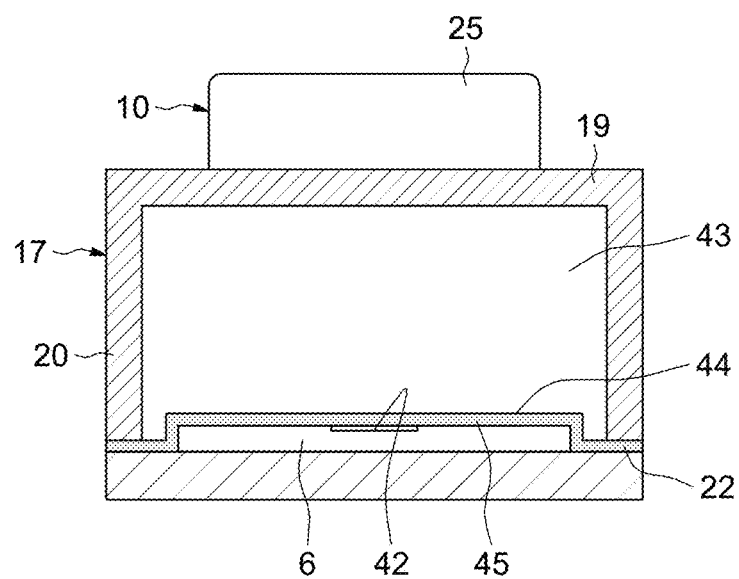
FIG. 8 represents a transverse local cross-section, according to VIII-VIII of the electronic device of FIG. 7.

The chip 6 is programmed to command the emitter 31 of the chip 28 and to treat the signals issued from the light sensor 9 and the light sensor 42. FIGS. 7 and 8 illustrate a variant embodiment of the electronic device 1 of FIGS. 5 and 6, in which the cap 17 comprises further an internal partition 43, which extends from the front wall 19 and the opposite sides 20a and 20b, towards the support plate 2 and the chip 6 and between and at a distance from the sleeve 10 and the light sensor 42.

The partition 43 has a rear nick 44 which is traversed by the chip 6. A glue bead 45 is interposed between the rear nick 44 of the partition 43 and the chip 6, and between the support plate 2 and the rear edge of the partition on each side of the chip 6.

So, the partition 43 divides the chamber 18 into a chamber portion 46 in which the sleeve 10 is located, and a chamber portion 47 in which the chip 28 and the light sensor 42 are located.

The partition 43 and the glue bead 45 contribute to prevent the light issued from the chip 28 in the chamber portion 47 from reaching the chamber portion 46, and in consequence from reaching the light sensor 9.

In this variant embodiment, the link ribs 36 and 37 are optional.

According to a variant embodiment (not shown on the drawings), the cap 17 of the electronic device 1 of FIGS. 1 to 4 can also comprise a partition equivalent to the partition 43, traversed by the chip 6 and attached by means of the glue beads 45, or located between the chip 6 and the chip 28 and attached only to the support plate 2 by a glue bead.

According to a variant embodiment, the sleeve 10 can be made so as not to protrude from the front wall 19 of the cap 17.

According to a variant embodiment, a complementary optical element (not shown on the drawings), such as a light filter, can be mounted on the light sensor 9 of the chip 6.

According to a variant embodiment, the connection wires 6a can be replaced, by connection elements interposed between the front face of the support plate 2 and the rear face of the chip 6.

The electronic device 1 is particularly adapted to form a proximity sensor and/or an image sensor.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device, comprising:
    a support plate having a first face and a second face;
    a first electronic integrated circuit chip having a rear face mounted on the second face of the support plate, the first electronic integrate circuit chip including an optical component;
    a sleeve having a traversing passage, a rear edge, and a front edge, wherein the rear edge is coupled to the second face of the first electronic integrated circuit chip, wherein the optical component of the first electronic integrated circuit chip is facing the traversing passage of the sleeve;
    at least one optical element in the traversing passage of the sleeve, the at least one optical element being configured to allow light to pass through;
    a cap coupled to the support plate, the cap and the support plate delimiting a chamber, the first electronic integrated circuit chip being located in the chamber, the cap including an upper portion having a through passage, the front edge of the sleeve located outside of the through passage;
    a second electronic integrated circuit chip mounted on the second face; and
    a glue bead between the first electronic integrated circuit chip and the rear edge of the sleeve.

2. The electronic device according to claim 1, wherein a portion of the cap overlaps a portion of the sleeve.

3. The electronic device according to claim 1, wherein the cap is overlapping a stepped portion of the sleeve.

4. The electronic device according to claim 3, comprising a glue bead between a surface of the sleeve and a surface of the cap.

5. The electronic device according to claim 3, wherein the sleeve comprises a first portion inside the chamber of the cap and a second portion traversing the through passage of the cap.

6. The electronic device according to the claim 5, comprising a gap between the sleeve and the through passage of the cap.

7. The electronic device according to claim 1, wherein the first electronic integrated circuit chip includes a light sensor, wherein the second electronic integrated circuit chip includes a light emitter.

8. An electronic device, comprising:
    a support plate having a first face and a second face;
    a first electronic integrated circuit chip having a rear face mounted on the second face of the support plate, the first electronic integrate circuit chip including an optical component;
    a sleeve having a traversing passage, a rear edge, and a front edge, wherein the rear edge is coupled to the second face of the first electronic integrated circuit chip, wherein the optical component of the first electronic integrated circuit chip is facing the traversing passage of the sleeve;
    at least one optical element in the traversing passage of the sleeve, the at least one optical element being configured to allow light to pass through;
    a cap coupled to the support plate, the cap and the support plate delimiting a chamber, the first electronic integrated circuit chip being located in the chamber, the cap including an upper portion having a through passage, the front edge of the sleeve located outside of the through passage;
    a second electronic integrated circuit chip mounted on the second face; and
    a glue bead between the support plate and a peripheral wall of the cap.

9. The electronic device according to claim 8, wherein the first electronic integrated circuit chip includes a light sensor, wherein the second electronic integrated circuit chip includes a light emitter.

10. An electronic device, comprising:
    a support plate having a first face and a second face;
    a first electronic integrated circuit chip having a rear face mounted on the second face of the support plate, the first electronic integrate circuit chip including an optical component;
    a sleeve having a traversing passage, a rear edge, and a front edge, wherein the rear edge is coupled to the second face of the first electronic integrated circuit chip, wherein the optical component of the first electronic integrated circuit chip is facing the traversing passage of the sleeve;

at least one optical element in the traversing passage of the sleeve, the at least one optical element being configured to allow light to pass through;

a cap coupled to the support plate, the cap and the support plate delimiting a chamber, the first electronic integrated circuit chip being located in the chamber, the cap including an upper portion having a through passage, the front edge of the sleeve located outside of the through passage; and a second electronic integrated circuit chip mounted on the second face, wherein the optical component of the first electronic integrated circuit chip is a first light sensor, wherein the first electronic integrated circuit chip includes a second light sensor, the second light sensor being optically isolated from the first light sensor.

11. The electronic device according to claim 10, wherein a portion of the cap overlaps a portion of the sleeve.

12. An electronic device, comprising:

a support plate having a first face and a second face;

a first electronic integrated circuit chip having a rear face mounted on the second face of the support plate, the first electronic integrate circuit chip including an optical component;

a sleeve having a traversing passage, a rear edge, and a front edge, wherein the rear edge is coupled to the second face of the first electronic integrated circuit chip, wherein the optical component of the first electronic integrated circuit chip is facing the traversing passage of the sleeve;

at least one optical element in the traversing passage of the sleeve, the at least one optical element being configured to allow light to pass through;

a cap coupled to the support plate, the cap and the support plate delimiting a chamber, the first electronic integrated circuit chip being located in the chamber, the cap including an upper portion having a through passage, the front edge of the sleeve located outside of the through passage; and a second electronic integrated circuit chip mounted on the second face, wherein the sleeve includes projecting ribs that extend into recesses in a wall of the cap, wherein a surface of the sleeve extends across the chamber.

13. The electronic device according to claim 12, wherein the cap comprises an internal partition that divides the chamber into first and second chamber portions, the sleeve located in the first chamber portion and the second electronic integrated circuit chip located in the second chamber portion.

14. The electronic device according to claim 13, wherein the optical component of the first electronic integrated circuit chip is a first light sensor, wherein the first electronic integrated circuit chip includes a second light sensor, wherein the second light sensor is located in the second chamber portion.

15. An electronic device, comprising:

a substrate;

a first chip coupled to the substrate, the first chip including a first optical component;

a second chip coupled to the substrate, the second chip including a second optical component;

a sleeve coupled to the substrate, the sleeve having a through opening over the first chip;

at least one lens in the through opening of the sleeve; and a cap coupled to the support plate that together delimit a chamber, wherein a portion of the cap overlaps and is coupled to the sleeve.

16. The electronic device according to claim 15, wherein the cap comprises a wall extending across the chamber such that the chamber is divided into a first chamber portion and a second chamber portion, wherein the first optical component of the first chip is in the first chamber portion and the second optical component of the second chip is in the second chamber portion.

17. The electronic device according to claim 16, wherein the first chip includes a third optical component, wherein the third optical component is in the second chamber portion.

18. The electronic device according to claim 16, wherein the wall of the cap is coupled to a surface of the first chip.

19. A method, comprising:

coupling a first chip to a substrate, the first chip including a first optical sensor;

coupling a second chip to the substrate, the second chip including an optical emitter;

coupling a sleeve to a surface of the first chip, the sleeve including a through opening and at least one optical element located in the through opening, the at least one optical element facing the first optical sensor and configured to allow light to pass through; and coupling a cap to the substrate and the sleeve, wherein coupling the cap to the sleeve comprises overlapping an upper portion of the sleeve with the cap and providing adhesive therebetween.

20. The method according to claim 19, wherein the cap includes a through opening, wherein a portion of the sleeve extends through the through opening.

* * * * *

UNITED STATES PATENT AND TRADEMARK OFFICE
CERTIFICATE OF CORRECTION

PATENT NO. : 11,127,874 B2
APPLICATION NO. : 16/594792
DATED : September 21, 2021
INVENTOR(S) : Colin Campbell et al.

It is certified that error appears in the above-identified patent and that said Letters Patent is hereby corrected as shown below:

In the Claims

Column 5, Claim 1, Line 54:
"electronic integrate circuit" should read: --electronic integrated circuit--.

Column 6, Claim 8, Line 31:
"electronic integrate circuit" should read: --electronic integrated circuit--.

Column 6, Claim 10, Line 60:
"electronic integrate circuit" should read: --electronic integrated circuit--.

Column 7, Claim 12, Line 23:
"electronic integrate circuit" should read: --electronic integrated circuit--.

Signed and Sealed this
Seventeenth Day of May, 2022

Katherine Kelly Vidal
*Director of the United States Patent and Trademark Office*